United States Patent
Bang et al.

(10) Patent No.: US 6,346,481 B1
(45) Date of Patent: Feb. 12, 2002

(54) METHOD OF REDUCING PITTING OF A COATED HEATER

(75) Inventors: Won Bang, Santa Clara; Chen-An Chen, Milpitas, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/637,839

(22) Filed: Aug. 12, 2000

(51) Int. Cl.⁷ .............................................. H01L 21/311
(52) U.S. Cl. ........................................ 438/694; 438/767
(58) Field of Search ................................ 438/680, 692, 438/694, 702, 715, 767, 618, 778, 779, 789, 790

(56) References Cited

U.S. PATENT DOCUMENTS

| | | | | |
|---|---|---|---|---|
| 4,356,374 A | * | 10/1982 | Noyori et al. ........ | 219/121 PE |
| 5,958,519 A | * | 9/1999 | Wang et al. ............. | 427/443.2 |
| 6,036,829 A | * | 3/2000 | Yamada et al. ............. | 204/427 |
| 6,162,293 A | * | 12/2000 | Kijima et al. ................ | 117/104 |

FOREIGN PATENT DOCUMENTS

JP      05110199        * 11/1994

* cited by examiner

*Primary Examiner*—David Neims
*Assistant Examiner*—Phuc T. Dang
(74) *Attorney, Agent, or Firm*—Townsend and Townsend and Crew

(57) ABSTRACT

Provided herein is a method of depositing a film on a substrate in a high temperature chemical vapor deposition (CVD) reactor, comprising the steps of polishing sharp corner(s) of the surface of a heater, wherein the heater provides heat to the substrate for deposition; coating the polished heater surface with a coating material; and depositing a film on the substrate in the CVD reactor, wherein the substrate is heated through the coated polished heater. Such method of polishing may also be used for reducing pitting of a coated heater and protecting the heater from corrosive environment in a CVD reactor.

18 Claims, 2 Drawing Sheets

METHOD OF REDUCING PITTING OF A COATED HEATER

BACKGROUND OF THE INVENTION

1. Field of the Invention

The present invention relates generally to the field of semiconductor manufacturing. More specifically, the present invention relates to a method of depositing a film on a substrate in a high temperature chemical vapor deposition reactor so as to reduce pitting of a coated heater and thereby protect the heater from a corrosive environment.

2. Description of the Related Art

Chemical vapor deposition (CVD) is a well known process used in the semiconductor industry for applying a thin layer or film of material to a substrate, typically a semiconductor wafer, by introduction of reactant gasses in the presence of applied heat. Typically, CVD processes are conducted at elevated temperatures to accelerate the chemical reaction and produce high quality layers or films.

High temperature CVD reactors often rely on heaters to heat the silicon wafers for deposition of metal or dielectric films. The wafer is typically held on a flat susceptor or other heater element. In conventional CVD systems, aluminum heaters are commonly used. When used for depositing a film such as titanium, aluminum heaters may experience some limitations such as aluminum corrosion, temperature limitations, unwanted deposition, and manufacturing inefficiency. The aluminum corrosion caused by chlorine atoms and ions that are released into the process chamber when the titanium film is formed not only damages the heater, but may also lead to processing degradation issues relating to metal contamination in the devices and particulate generation.

Besides being susceptible to corrosion from chlorine, an aluminum heater is generally limited to operating temperatures less than about 480° C. At temperatures greater than about 480° C., aluminum heaters experience softening, possibly resulting from damage to the heater. Additionally, chemical species, such as chlorine, may more aggressively attack and corrode aluminum heaters at higher temperatures than at lower temperatures, thereby reducing the operational lifetime of the heater and undesirably requiring more frequent heater replacement. Heater replacement is expensive not only because of the cost of the heater, but also because the productive use of the deposition chamber is lost for the time the heater is being replaced.

In order to solve the above-mentioned problems, ceramic heaters or susceptors made of glass carbon or graphite coated with aluminum nitride (AlN) have been proposed as an alternative to using aluminum heaters in some applications. Fabricating ceramic heaters and using them in deposition processes, however, introduces several challenges.

Ceramic heaters typically have an electric heating element within a ceramic heater body, made of materials such as alumina ($Al_2O_3$) or aluminum nitride, which protects the heating element from the corrosive environment of the deposition chamber while transmitting heat from the heating element to the substrate. Typically harder and more brittle than metals, ceramic materials may be difficult to machine, thereby requiring a simple mechanical design. Being somewhat brittle, ceramic may crack from thermal shock if repeatedly subjected to a sufficient thermal gradient. Cracking may also arise from the differential thermal expansion at the transition from the ceramic heater assembly to a material with a different thermal expansion coefficient.

Therefore, conventional heaters (for example, aluminum or ceramic) possess certain limitations for high temperature CVD processes. The prior art is deficient in the lack of effective means of depositing a film on a substrate in a high temperature CVD reactor. Additionally, the prior art is deficient in the lack of effective means of reducing pitting of coated heaters and protecting the heaters from the corrosive environment in the process chamber. The present invention fulfills these long-standing needs and desires in the art.

SUMMARY OF THE INVENTION

In one aspect, there is provided a method of depositing a film on a substrate in a high temperature chemical vapor deposition reactor, comprising the steps of polishing sharp corner(s) of the surface of a heater that provides heat to the substrate for deposition; coating the polished heater surface with a coating material; and depositing a film on the substrate in the CVD reactor, wherein the substrate is heated through the coated polished heater.

In another aspect, there is provided a method of protecting a heater from a corrosive environment in a chemical vapor deposition reactor, comprising the steps of polishing sharp corner(s) of the surface of the heater; and coating the polished heater surface with a coating material, thereby protecting the heater from corrosive environment in a chemical vapor deposition reactor.

In still another aspect, there is provided a method of reducing pitting of a coated heater in a chemical vapor deposition reactor, comprising the steps of polishing sharp corner(s) of the surface of the heater; and coating the polished heater surface with a coating material, wherein the resulting coated heater has a surface with reduced pitting compared to a coated non-polished heater surface.

Other and further aspects, features, and advantages of the present invention will be apparent from the following description of the embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate embodiments of the invention and therefore are not to be considered limiting in their scope.

FIG. 2A shows that with sharp corners (not polished), conformal coverage of the heater was not possible due to the nature of sputtering deposition growth. FIG. 2B shows that with polished corners, no pitting appeared due to the conformal coating coverage.

DETAILED DESCRIPTION OF THE INVENTION

Figure 1:
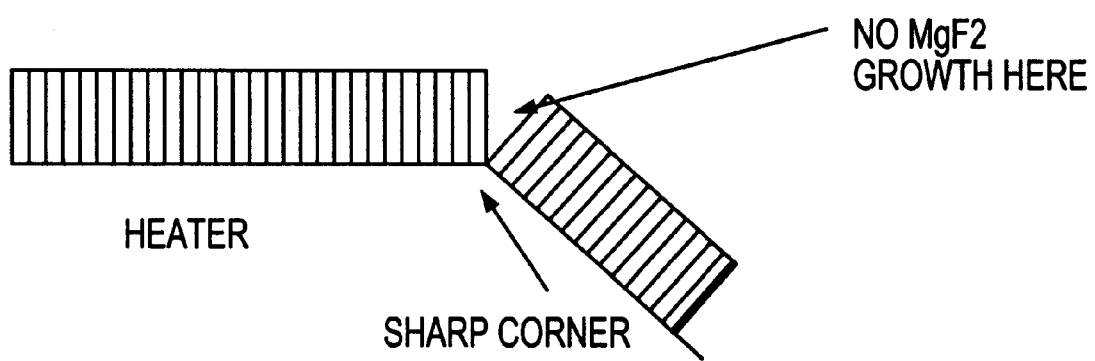
FIG. 1 is a schematic drawing of a heater with a sharp corner which demonstrates that no MgF2 coating grows at the edge of the corner.

High temperature chemical vapor deposition (CVD) reactors often rely on heaters to heat the silicon wafers for deposition of metal or dielectric films. The heater is often coated with a coating material. (e.g., MgF2) to protect the heater from corrosive process gases. It has been shown that sharp corners on the heater surface are not well coated due to the nature of the coating growth on the substrate (see FIG. 1). Non-coated corners can expose the surface of the heater to attack, pit the surface of the heater and potentially cause the coating to flake and crack It is known that MgF2 grows perpendicular to the surface of the substrate. MgF2 does not grow, however, at the sharp corner of the heater surface (see FIG. 1). Any sharp corner region of the heater will have the edge of the corner not fully covered by the MgF2 coating. When some regions are not covered (e.g., corners), these regions are attached preferentially, and eventually leads to pitting which can cause particles and contamination.

Figure 2A:
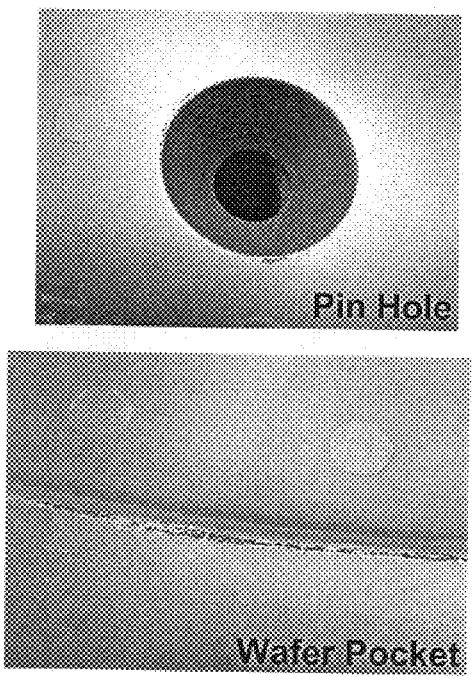
FIGS. 2A and 2B show a coating coverage comparison between non-polished and polished heaters.
Figure 2B:
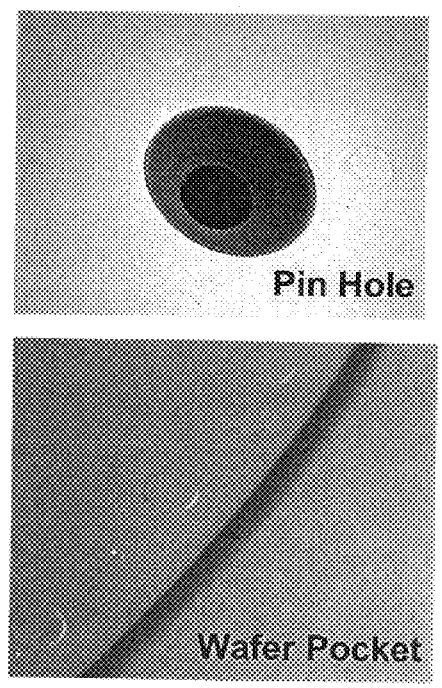

To reduce or eliminate the pitting that is observed on the heater, the present invention provide a method wherein the edges of the sharp corners are polished so that the sharp corners no longer exist, and the coating will grow uniformly on the heater surface. FIGS. 2A and 2B demonstrate the effect of polishing the sharp corners of the heater surface in a CVD process by comparing non-polished and polished heater surface for chemical vapor deposition. The pictures were taken after 65 hrs of chemical attacks at 620° C., at 5 Torr, and with 2000 NF3 and 2000 Ar as reactant gases. For non-polished heater surface, conformal coverage was not possible due to the nature of sputtering deposition growth. In contrast, no pitting appeared on the polished heater surface because of the conformal coating coverage.

In one aspect, there is provided a method of depositing a film on a substrate in a high temperature chemical vapor deposition (CVD) reactor. This method comprises the steps of polishing sharp corner(s) of the surface of a heater so that the heater provides heat to the substrate for deposition. Subsequently, the polished heater surface is coated with a coating material and a film is deposited on the substrate in the CVD reactor so that the substrate is heated through the coated polished heater. Typically, the substrate is a semiconductor wafer. The heater may be made of a thermal conductive material. Representative examples of thermal conductive materials include aluminum, ceramic, glass carbon or graphite coated with aluminum nitride. Representative examples of materials which may be used to coat the surface of the heater include MgF2, CeF and SrF2. This method is applicable for depositing a metal or dielectric film on a substrate in a CVD process at a temperature of greater than about 480° C.

In another aspect, there is provided a method of protecting a heater from corrosive environment in a chemical vapor deposition reactor, comprising the steps of polishing sharp corner(s) of the surface of the heater; and coating the polished heater surface with a coating material, thereby protecting the heater from corrosive environment in a chemical vapor deposition reactor. The heater may be made of a thermal conductive material, such as aluminum, ceramic, glass carbon or graphite coated with aluminum nitride. Representative examples of materials which may be used to coat the surface of the heater include MgF2, CeF and SrF2.

In still another aspect, there is provided a method of reducing pitting of a coated heater in a chemical vapor deposition reactor, comprising the steps of polishing sharp corner(s) of the surface of the heater; and coating the polished heater surface with a coating material, wherein the resulting coated heater has a surface with reduced pitting compared to a coated non-polished heater surface. The heater is generally made of a thermal conductive material, such as aluminum, ceramic, glass carbon or graphite coated with aluminum nitride. Representative materials such as MgF2, CeF or SrF2 may be used for coating the heater surface.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A method of depositing a film on a substrate in a high temperature chemical vapor deposition reactor, comprising the steps of:

polishing one or more sharp corners of a surface of a heater, wherein said heater provides heat to said substrate in said reactor;

coating the polished heater surface with a coating material; and depositing a film on said substrate in said reactor, wherein said substrate is heated through the coated polished heater.

2. The method of claim 1, wherein said substrate is a semiconductor wafer.

3. The method of claim 1, wherein said temperature is greater than about 480° C.

4. The method of claim 1, wherein said heater is made of a thermal conductive material selected from the group consisting of aluminum, ceramic, glass carbon and graphite coated with aluminum nitride.

5. The method of claim 1, wherein said film is a metal or dielectric film.

6. The method of claim 1, wherein said coating material is selected from the group consisting of MgF2, CeF and SrF2.

7. A method of protecting a heater from corrosive environment in a chemical vapor deposition reactor, comprising the steps of:

polishing one or more sharp corners of a surface of the heater; and coating the polished heater surface with a coating material, thereby protecting the heater from corrosive environment in a chemical vapor deposition reactor.

8. The method of claim 7, wherein said heater is made of a thermal conductive material selected from the group consisting of aluminum, ceramic, glass carbon and graphite coated with aluminum nitride.

9. The method of claim 7, wherein said coating material is selected from the group consisting of MgF2, CeF and SrF2.

10. A method of reducing pitting of a coated heater in a chemical vapor deposition reactor, comprising the steps of:

polishing one or more sharp corners of a surface of the heater; and coating the polished heater surface with a coating material, wherein the resulting coated heater has a surface with reduced pitting compared to a coated non-polished heater surface.

11. The method of claim 10, wherein said heater is made of a thermal conductive material selected from the group consisting of aluminum, ceramic, glass carbon and graphite coated with aluminum nitride.

12. The method of claim 10, wherein said coating material is selected from the group consisting of MgF2, CeF and SrF2.

13. A method of forming a film on a substrate, the method comprising:
- providing a coated heater including a surface having one or more sharp corners removed by polishing prior to formation of the coating on the heater;
- positioning the substrate on the coating;
- heating the wafer to a temperature using the heater; and
- performing chemical vapor deposition of the film on the substrate.

14. The method of claim 13, wherein said substrate is a semiconductor wafer.

15. The method of claim 13, wherein said temperature is greater than about 480° C.

16. The method of claim 13, wherein said heater is made of a thermal conductive material selected from the group consisting of aluminum, ceramic, glass carbon and graphite coated with aluminum nitride.

17. The method of claim 13, wherein said film is a metal or dielectric film.

18. The method of claim 13, wherein said coating is selected from the group consisting of MgF2, CeF and SrF2.

* * * * *